US008338922B1

(12) United States Patent
Sirinorakul et al.

(10) Patent No.: US 8,338,922 B1
(45) Date of Patent: Dec. 25, 2012

(54) MOLDED LEADFRAME SUBSTRATE SEMICONDUCTOR PACKAGE

(75) Inventors: Saravuth Sirinorakul, Bangkok (TH); Somchai Nondhasitthichai, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 462 days.

(21) Appl. No.: 12/661,444

(22) Filed: Mar. 16, 2010

Related U.S. Application Data (62) Division of application No. 12/287,174, filed on Oct. 6, 2008, now Pat. No. 7,790,512.

(60) Provisional application No. 61/002,138, filed on Nov. 6, 2007.

(51) Int. Cl.
*H01L 23/495* (2006.01)

(52) U.S. Cl. . 257/666; 257/734; 257/676; 257/E21.499; 257/E21.502; 257/E21.503; 257/E21.504; 257/E21.505; 257/E21.506

(58) Field of Classification Search ............... 257/666, 257/665, 671, 676, 734, 735, 787, E21.499, 257/E21.502, E21.503, E21.504, E21.505, 257/E21.506
See application file for complete search history.

(56) References Cited

U.S. PATENT DOCUMENTS

| | | | | |
|---|---|---|---|---|
| 3,611,061 A | 10/1971 | Segerson | | 317/234 R |
| 4,411,719 A | 10/1983 | Lindberg | | 156/64 |
| 4,501,960 A | 2/1985 | Jouvet et al. | | 235/492 |
| 4,801,561 A | 1/1989 | Sankhagowit | | 437/207 |
| 4,855,672 A | 8/1989 | Shreeve | | 324/158 R |
| 5,247,248 A | 9/1993 | Fukunaga | | 324/158 |
| 5,248,075 A | 9/1993 | Young et al. | | 228/5.1 |
| 5,343,076 A | 8/1994 | Katayama et al. | | |
| 5,396,185 A | 3/1995 | Honma et al. | | 324/754 |
| 5,397,921 A | 3/1995 | Karnezos | | |
| 5,479,105 A | 12/1995 | Kim et al. | | 324/755 |
| 5,535,101 A | 7/1996 | Miles et al. | | |
| 5,596,231 A | 1/1997 | Combs | | |
| 5,843,808 A | 12/1998 | Karnezos | | |
| 5,990,692 A | 11/1999 | Jeong et al. | | 324/755 |
| 6,072,239 A | 6/2000 | Yoneda et al. | | 257/730 |
| 6,111,324 A | 8/2000 | Sheppard et al. | | |
| 6,159,770 A | 12/2000 | Tetaka et al. | | 438/112 |
| 6,197,615 B1 | 3/2001 | Song et al. | | |
| 6,229,200 B1 | 5/2001 | Mclellan et al. | | |
| 6,242,281 B1 | 6/2001 | Mclellan et al. | | |
| 6,250,841 B1 | 6/2001 | Ledingham | | |
| 6,284,569 B1 | 9/2001 | Sheppard et al. | | |
| 6,285,075 B1 | 9/2001 | Combs et al. | | |
| 6,294,100 B1 | 9/2001 | Fan et al. | | |
| 6,304,000 B1 | 10/2001 | Isshiki et al. | | 257/782 |
| 6,326,678 B1 | 12/2001 | Karnezos et al. | | |
| 6,329,711 B1 | 12/2001 | Kawahara et al. | | 257/698 |
| 6,353,263 B1 | 3/2002 | Dotta et al. | | 257/777 |

(Continued)

OTHER PUBLICATIONS

Office Action dated May 11, 2010, U.S. Appl. No. 12/002,054, filed Dec. 14, 2007, Somchai Nondhasitthichai et al.

(Continued)

*Primary Examiner* — David Nhu
(74) *Attorney, Agent, or Firm* — Haverstock & Owens LLP (57) ABSTRACT

A process for forming semiconductor packages includes partially etching a leadframe matrix, encapsulating it with mold compound, placing a semiconductor die in a leadframe unit and singulating the leadframe matrix. A system for forming semiconductor packages includes means for partially etching a leadframe matrix, means for encapsulating it with mold compound, means for placing a semiconductor die in a leadframe unit and means for singulating the leadframe matrix.

9 Claims, 13 Drawing Sheets

U.S. PATENT DOCUMENTS

| | | | |
|---|---|---|---|
| 6,376,921 B1 | 4/2002 | Yoneda et al. | 257/787 |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | |
| 6,451,709 B1 | 9/2002 | Hembree | 438/759 |
| 6,455,348 B1 | 9/2002 | Yamaguchi | 438/106 |
| 6,489,218 B1 | 12/2002 | Kim et al. | |
| 6,498,099 B1 | 12/2002 | McLellan et al. | |
| 6,507,116 B1 | 1/2003 | Caletka et al. | |
| 6,545,332 B2 | 4/2003 | Huang | |
| 6,545,347 B2 | 4/2003 | McClellan | |
| 6,552,417 B2 | 4/2003 | Combs | |
| 6,552,423 B2 | 4/2003 | Song et al. | |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | |
| 6,586,834 B1 | 7/2003 | Sze et al. | |
| 6,635,957 B2 | 10/2003 | Kwan et al. | |
| 6,667,191 B1 | 12/2003 | McLellan et al. | |
| 6,683,368 B1 | 1/2004 | Mostafazadeh | |
| 6,686,667 B2 | 2/2004 | Chen et al. | |
| 6,703,696 B2 | 3/2004 | Ikenaga et al. | 257/678 |
| 6,723,585 B1 | 4/2004 | Tu et al. | |
| 6,724,071 B2 | 4/2004 | Combs | |
| 6,734,044 B1 | 5/2004 | Fan et al. | |
| 6,734,552 B2 | 5/2004 | Combs et al. | |
| 6,737,755 B1 | 5/2004 | McLellan et al. | |
| 6,764,880 B2 | 7/2004 | Wu et al. | 438/123 |
| 6,781,242 B1 | 8/2004 | Fan et al. | |
| 6,800,948 B1 | 10/2004 | Fan et al. | |
| 6,812,552 B2 | 11/2004 | Islam et al. | |
| 6,818,472 B1 | 11/2004 | Fan et al. | |
| 6,818,978 B1 | 11/2004 | Fan | |
| 6,818,980 B1 | 11/2004 | Pedron, Jr. | |
| 6,841,859 B1 | 1/2005 | Thamby et al. | |
| 6,876,066 B2 | 4/2005 | Fee et al. | 257/666 |
| 6,893,169 B1 | 5/2005 | Exposito et al. | |
| 6,897,428 B2 | 5/2005 | Minamio et al. | |
| 6,933,176 B1 | 8/2005 | Kirloskar et al. | |
| 6,933,594 B2 | 8/2005 | McLellan et al. | |
| 6,940,154 B2 | 9/2005 | Pedron et al. | 257/666 |
| 6,946,324 B1 | 9/2005 | McLellan et al. | |
| 6,964,918 B1 | 11/2005 | Fan et al. | |
| 6,967,126 B2 | 11/2005 | Lee et al. | 438/122 |
| 6,979,594 B1 | 12/2005 | Fan et al. | |
| 6,982,491 B1 | 1/2006 | Fan et al. | |
| 6,984,785 B1 | 1/2006 | Diao et al. | |
| 6,989,294 B1 | 1/2006 | McLellan et al. | |
| 6,995,460 B1 | 2/2006 | McLellan et al. | |
| 7,008,825 B1 | 3/2006 | Bancod et al. | 438/123 |
| 7,009,286 B1 | 3/2006 | Kirloskar et al. | |
| 7,049,177 B1 | 5/2006 | Fan et al. | |
| 7,060,535 B1 | 6/2006 | Sirinorakul | |
| 7,071,545 B1 | 7/2006 | Patel et al. | |
| 7,091,581 B1 | 8/2006 | McLellan et al. | |
| 7,101,210 B2 | 9/2006 | Lin et al. | 439/331 |
| 7,102,210 B2 | 9/2006 | Ichikawa | 257/666 |
| 7,205,178 B2 | 4/2007 | Shiu et al. | 438/110 |
| 7,224,048 B1 | 5/2007 | McLellan et al. | |
| 7,247,526 B1 | 7/2007 | Fan et al. | 438/123 |
| 7,259,678 B2 | 8/2007 | Brown et al. | |
| 7,274,088 B2 | 9/2007 | Wu et al. | |
| 7,314,820 B2 | 1/2008 | Lin et al. | 438/617 |
| 7,315,080 B1 | 1/2008 | Fan et al. | |
| 7,342,305 B1 | 3/2008 | Diao et al. | |
| 7,344,920 B1 | 3/2008 | Kirloskar et al. | |
| 7,348,663 B1 | 3/2008 | Kirloskar et al. | |
| 7,358,119 B2 | 4/2008 | McLelland et al. | |
| 7,371,610 B1 | 5/2008 | Fan et al. | |
| 7,372,151 B1 | 5/2008 | Fan et al. | |
| 7,381,588 B1 | 6/2008 | Patel et al. | |
| 7,399,658 B2 | 7/2008 | Shim et al. | |
| 7,408,251 B2 | 8/2008 | Hata et al. | 257/678 |
| 7,411,289 B1 | 8/2008 | McLellan et al. | |
| 7,449,771 B1 | 11/2008 | Fan et al. | |
| 7,482,690 B1 | 1/2009 | Fan et al. | |
| 7,495,319 B2 | 2/2009 | Fukuda et al. | |
| 7,507,603 B1 | 3/2009 | Berry et al. | |
| 7,595,225 B1 | 9/2009 | Fan et al. | |
| 7,714,418 B2 | 5/2010 | Lim et al. | |
| 7,790,512 B1 * | 9/2010 | Sirinorakul et al. | 438/123 |
| 2002/0109214 A1 | 8/2002 | Minamio et al. | |
| 2003/0006055 A1 | 1/2003 | Chien-Hung et al. | |
| 2003/0045032 A1 | 3/2003 | Abe | |
| 2003/0071333 A1 | 4/2003 | Matsuzawa | |
| 2003/0143776 A1 | 7/2003 | Pedron, Jr. et al. | |
| 2003/0178719 A1 | 9/2003 | Combs et al. | |
| 2003/0201520 A1 | 10/2003 | Knapp et al. | 257/666 |
| 2003/0207498 A1 | 11/2003 | Islam et al. | 438/120 |
| 2004/0014257 A1 | 1/2004 | Kim et al. | 438/111 |
| 2004/0046237 A1 | 3/2004 | Abe et al. | |
| 2004/0046241 A1 | 3/2004 | Combs et al. | |
| 2004/0070055 A1 | 4/2004 | Punzalan et al. | |
| 2004/0080025 A1 | 4/2004 | Kasahara et al. | |
| 2004/0110319 A1 | 6/2004 | Fukutomi et al. | 438/106 |
| 2005/0003586 A1 | 1/2005 | Shimanuki et al. | |
| 2005/0077613 A1 | 4/2005 | McLellan et al. | |
| 2005/0236701 A1 | 10/2005 | Minamio et al. | |
| 2005/0263864 A1 | 12/2005 | Islam et al. | |
| 2006/0071351 A1 | 4/2006 | Lange | |
| 2006/0192295 A1 | 8/2006 | Lee et al. | |
| 2006/0223229 A1 | 10/2006 | Kirloskar et al. | |
| 2006/0223237 A1 | 10/2006 | Combs et al. | |
| 2006/0273433 A1 | 12/2006 | Itou et al. | |
| 2007/0001278 A1 | 1/2007 | Jeon et al. | |
| 2007/0013038 A1 | 1/2007 | Yang | |
| 2007/0029540 A1 | 2/2007 | Kajiwara et al. | |
| 2007/0200210 A1 | 8/2007 | Zhao et al. | 257/676 |
| 2007/0235217 A1 | 10/2007 | Workman | |
| 2008/0048308 A1 | 2/2008 | Lam | 257/686 |
| 2008/0150094 A1 | 6/2008 | Anderson | 257/659 |
| 2009/0230525 A1 | 9/2009 | Chang Chien et al. | |

OTHER PUBLICATIONS

Michael Quirk and Julian Serda, Semiconductor Manufacturing Technology, Pearson Education International, Pearson Prentice Hall, 2001, p. 587-588.

Notice of Allowance dated Jul. 14, 2010, U.S. Appl. No. 12/287,174, filed Oct. 6, 2008, Saravuth Sirinorakul et al.

Office Action dated Apr. 25, 2012, U.S. Appl. No. 12/960,268, filed Dec. 3, 2010, Somchai Nondhasitthichai et al.

* cited by examiner

MOLDED LEADFRAME SUBSTRATE SEMICONDUCTOR PACKAGE

This application is a Divisional Application of the co-pending application Ser. No. 12/287,174, filed Oct. 6, 2008, now issued as U.S. Pat. No. 7,790,512, and titled MOLDED LEADFRAME SUBSTRATE SEMICONDUCTOR PACKAGE," which in turn claims priority of U.S. Provisional Patent application 61/002,138 filed Nov. 6, 2007, entitled "FRAME DESIGN AND MOLD DESIGN CONCEPT FOR MOLD DESIGN THICKNESS," both of which are hereby incorporated in their entirety.

RELATED APPLICATIONS

This application claims benefit of priority under 35 U.S.C. section 119(e) of co-pending U.S. Provisional Patent Application 61/002,138 filed Nov. 6, 2007, entitled FRAME DESIGN AND MOLD DESIGN CONCEPT FOR MOLD DESIGN THICKNESS which is incorporated herein by reference.

FIELD OF THE INVENTION

The present invention is in the field of semiconductor packaging and is more specifically directed methods of achieving optimum thicknesses for semiconductor packages.

BACKGROUND

Figure 1:
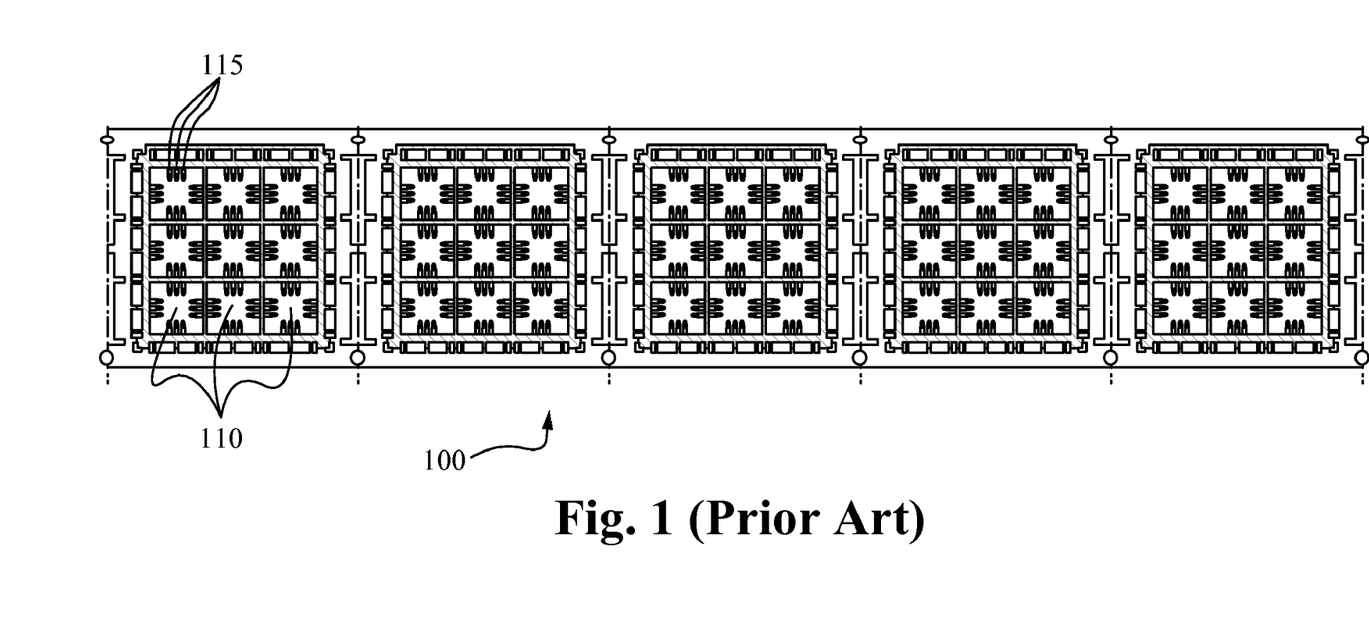
FIG. 1 shows a standard leadframe matrix.

In Leadframe Based Packaging, a leadframe matrix 100 in FIG. 1 is processed by placing singulated semiconductor die (not shown) into each individual leadframe unit 110. Then, bond pads on the die are wire bonded to an output pin 115 in the leadframe unit to effectuate a desired landing pattern onto a printed circuit board (not shown). Next, a mold compound is formed over the leadframe matrix 100 and allowed to set. Individual devices are marked, and the leadframe matrix is singulated by saw or other cutting apparatus into individual semiconductor devices. Although this process is well known, it does not allow for control of the thickness of the final package. The thickness of semiconductor devices is typically is dictated by the thickness of the die added to the thickness of the leadframe plus the mold compound. In certain applications, thinner semiconductor devices are desired. What is needed is a process and system for forming semiconductor leadframe packages with different desired thicknesses.

SUMMARY OF THE DISCLOSURE

One aspect of the invention is for a process of forming individual packaged semiconductor devices. To that end, a leadframe matrix has a thickness, a top surface and a bottom surface. At least one of the top surface and bottom surface is etched to form a selectively half etched leadframe having an etched pattern. The selectively half etched leadframe is mounted onto a tape carrier and then the selectively etched leadframe is encapsulated in a first mold compound such that the etched pattern is filled with mold compound. As a result, a selectively half etched molded leadframe is formed. At least one semiconductor device is mounted in at least one individual leadframe. The tape carrier is removed and the selectively half etched molded leadframe is singulated thereby forming individual packaged semiconductor devices. In some embodiments, the selectively half etched leadframe is encapsulated in a first mold compound by placing the selectively half etched leadframe between a top mold, having a film gate, and a bottom mold. A mold compound is injected in a liquid state through the film gate such that it encapsulates the selectively half etched leadframe thereby forming a selectively half etched molded leadframe. Alternatively, The selectively half etched leadframe can be encapsulated in a first mold compound by placing the selectively half etched leadframe between a top mold, having a pincer gate, and a bottom mold. Again, a mold compound in a liquid state is injected through the pincer gate such that it encapsulates the selectively half etched leadframe thereby forming a selectively half etched molded leadframe. In some embodiments, the top mold further comprises a vacuum pipe output. The process further comprises forming a near vacuum at the vacuum pipe to effectuate distribution of the first mold compound. In some embodiments, the process of further comprises encapsulating the selectively half etched molded leadframe in a second mold compound. Also, mounting at least one semiconductor device comprises mounting the at least one semiconductor device on the selectively half etched molded leadframe and wirebonding such that the at least one semiconductor device is encapsulated by the second mold compound. Alternatively, mounting at least one semiconductor device comprises mounting the at least one semiconductor device in a cavity within the individual leadframe and wirebonding such that the first mold compound encapsulates the at least one semiconductor device.

In another aspect of the disclosure, a system of assembling a semiconductor package comprises means for selectively etching at least one of a top surface and a bottom surface of a leadframe matrix. The system also has a means for mounting the selectively half etched leadframe onto a tape carrier annd means for encapsulating the selectively half etched leadframe in a first mold compound such that the etched pattern is filled with mold compound, thereby forming a selectively half etched molded leadframe. Also, the system has a means for mounting at least one semiconductor device in at least one individual leadframe, means for removing the tape carrier, and means for singulating the selectively half etched molded leadframe thereby forming individual packaged semiconductor devices. In some embodiments, the means for encapsulating the selectively half etched leadframe in a first mold compound has a means for placing the selectively half etched leadframe between a top mold, having a film gate, and a bottom mold. A means for injecting a mold compound in a liquid state through the film gate provides the mold compound such that it encapsulates the selectively half etched leadframe thereby forming a selectively half etched molded leadframe. Alternatively, the means for encapsulating the selectively half etched leadframe in a first mold compound comprises placing the selectively half etched leadframe between a top mold, having a pincer gate, and a bottom mold. A means for injecting a mold compound in a liquid state through the pincer gate provides the mold compound such that it encapsulates the selectively half etched leadframe thereby forming a selectively half etched molded leadframe. In some embodiments, the top mold further comprises a vacuum pump output and the system further comprises means for forming a near vacuum for effectuating distribution of mold compound.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail. For example, it is commonly known in the art of semiconductor device assembly that assembly is generally done on a matrix array of leadframes, often referred to as leadframe strips, each strip having a plurality of individual positions that will be processed in various ways to form individual packaged semiconductor devices. A position can have one or more semiconductor die within. The following description details exemplary embodiments of processes. It will be appreciated by the person of ordinary skill having the benefit of this disclosure that the steps taught or claimed need not be performed in the order shown. The process steps are able to be performed in an order that is not inconsistent with the teachings herein to achieve a desired end result.

Figure 2:
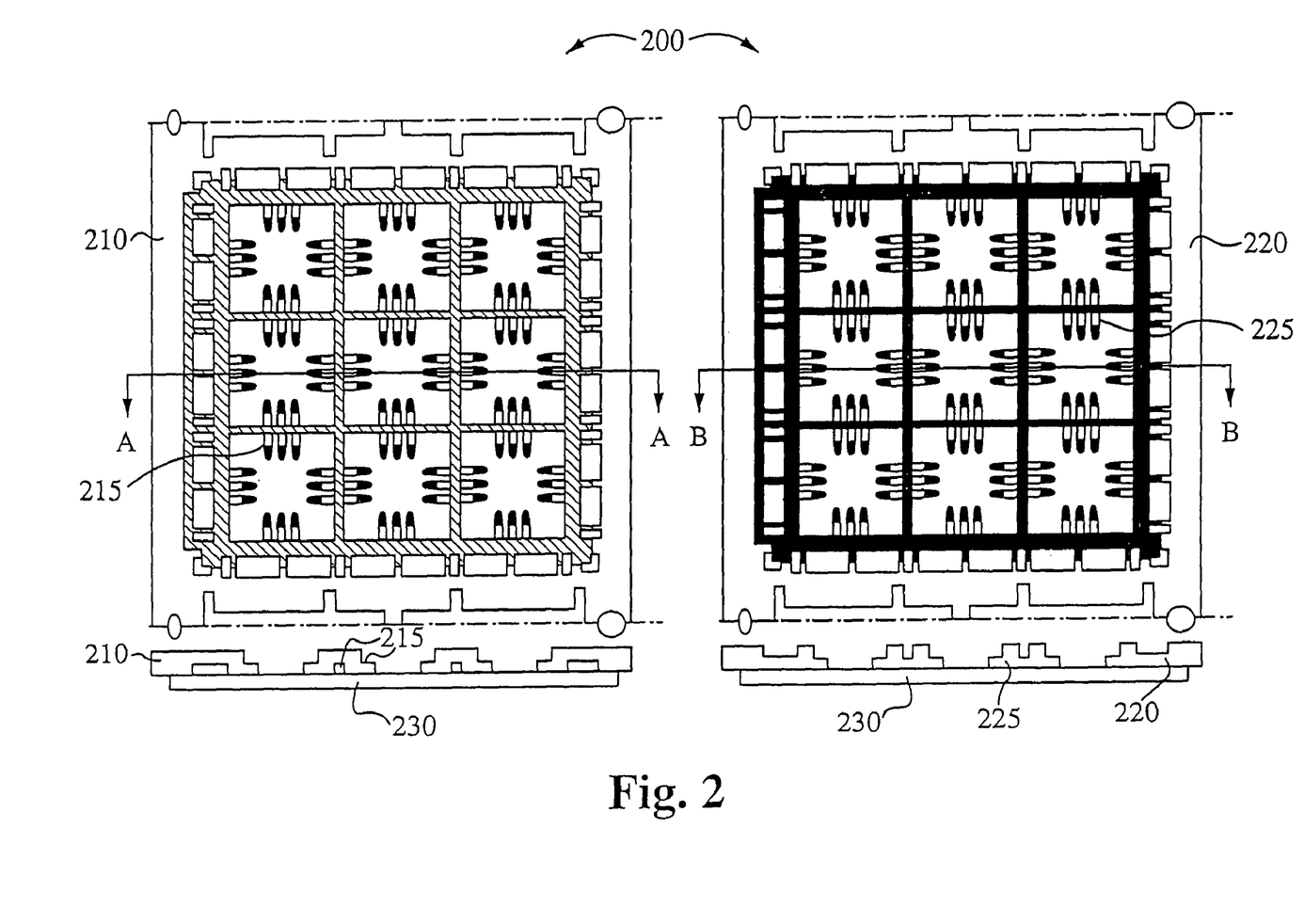
FIG. 2 shows two portions of half etched leadframe matrices from top and cross sectional views.

FIG. 2 shows two portions of leadframe matrices 200. The first is a portion of a leadframe matrix 210 that has been selectively etched from both the top and bottom surfaces. The perimeter of the matrix 211 is not etched and remains at full metal thickness with a nickel/Palladium/Gold coating to prevent corrosion. As will be shown later in a process of assembling individual packaged semiconductor devices, the perimeter 210 can be discarded in some applications. A cross section of the matrix 210 taken across the line A-A the portion of the matrix 210 having a full thickness and the portions that are etched from the bottom surface 215 and portions that are etched from the top surface 225. The various voids and cavities are able to be formed on the top or bottom surface of the matrix 210 to provide differing specific applications. Alternatively, the leadframe matrix 220 is etched from the top surface only. The etched portions 225 are visible in the cross section taken across the line B-B as forming cavities and voids 230. Such partially etched leadframes are referred to herein as half etched leadframes. In some embodiments, the half etched leadframe 200 is mounted to a carrier tape 230 to secure it during processing as shown in FIGS. 4A-4D and 5A-5D.

Figure 3A:
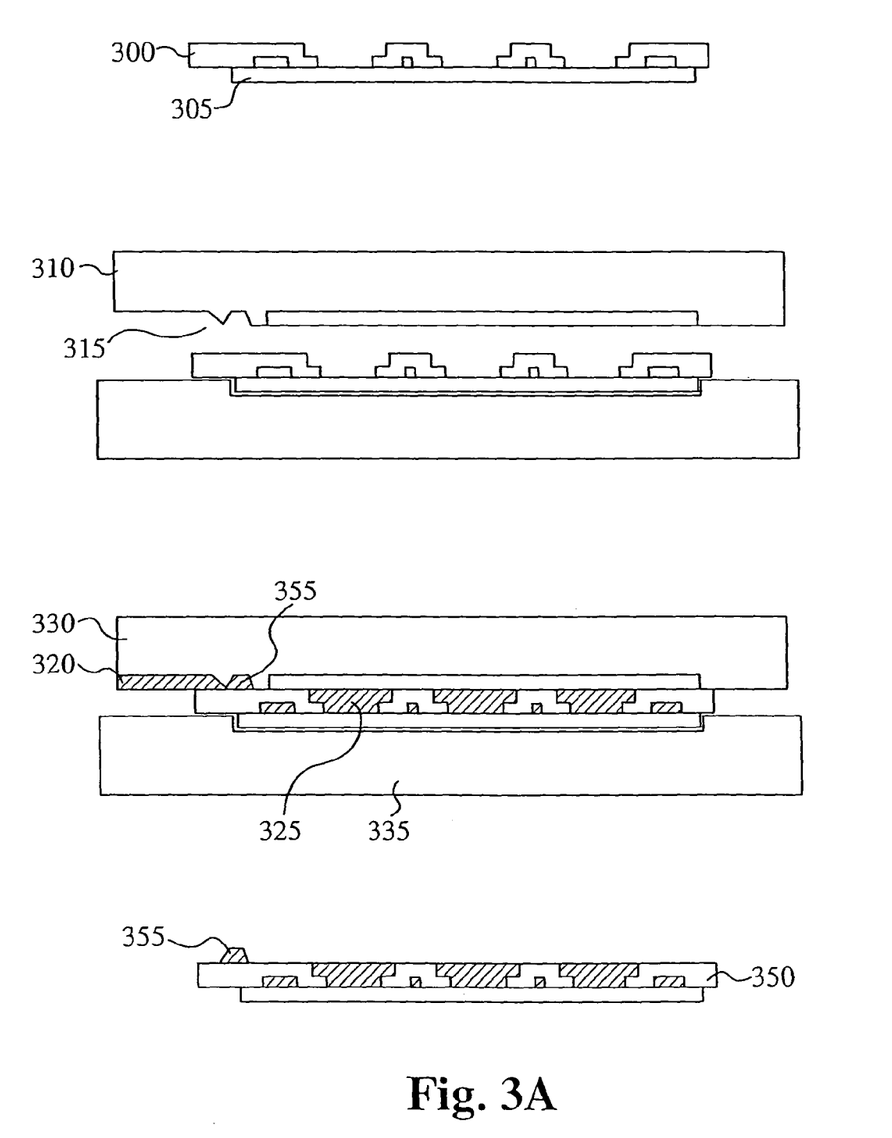
FIG. 3A is a process of forming a molded half etched leadframe per an embodiment of the current invention.
Figure 3B:
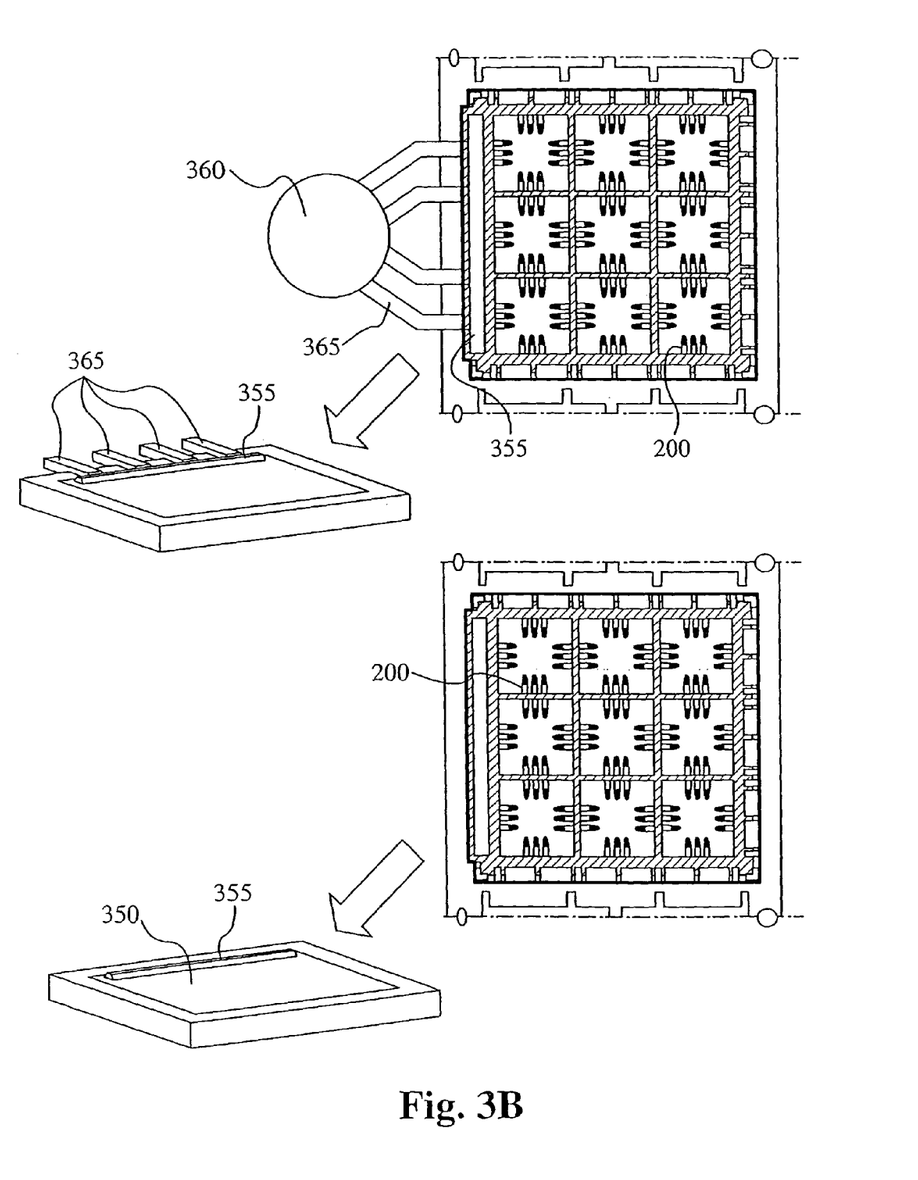
FIG. 3B shows another view of the process of forming a molded half etched leadframe of FIG. 3A.

FIG. 3A shows a process of forming a molded half etched leadframe 350. The half etched leadframe 300 in this example has been etched on both a top and a bottom surface. The half etched leadframe 300 is mounted to a tape carrier 305. The half etched leadframe 300 and carrier tape 305 are placed between a top mold 310 having a tape loader on the mold surface 313 and a bottom mold 335. The tape loader effectuates the movement of the half etched leadframe 300 through the mold. In some embodiments, the top mold 310 comprises a film gate 355. The film gate 355 encircles a perimeter of the leadframe 300 to allow the injection therein of a mold compound 325. The mold compound 325 is fed into the film gate 355 through a cavity 320. The mold compound 325 is allowed to cool and set and the molded half etched leadframe 350 is removed from the top mold 310 and bottom mold 335. In some embodiments, the tape carrier 305 is left attached to the molded half etched leadframe 350 to carry it through later assembly steps. The process of FIG. 3A is seen from top and isometric views in FIG. 3B. The leadframe matrix 305 is shown without the top mold 310. A mold pot and cull liquefies a mold compound and distributes the mold compound through mold runners 365 to the film gate 355. The mold pot and cull 360 and runners 365 are removed to leave the molded half etched leadframe 350.

Figure 3C:
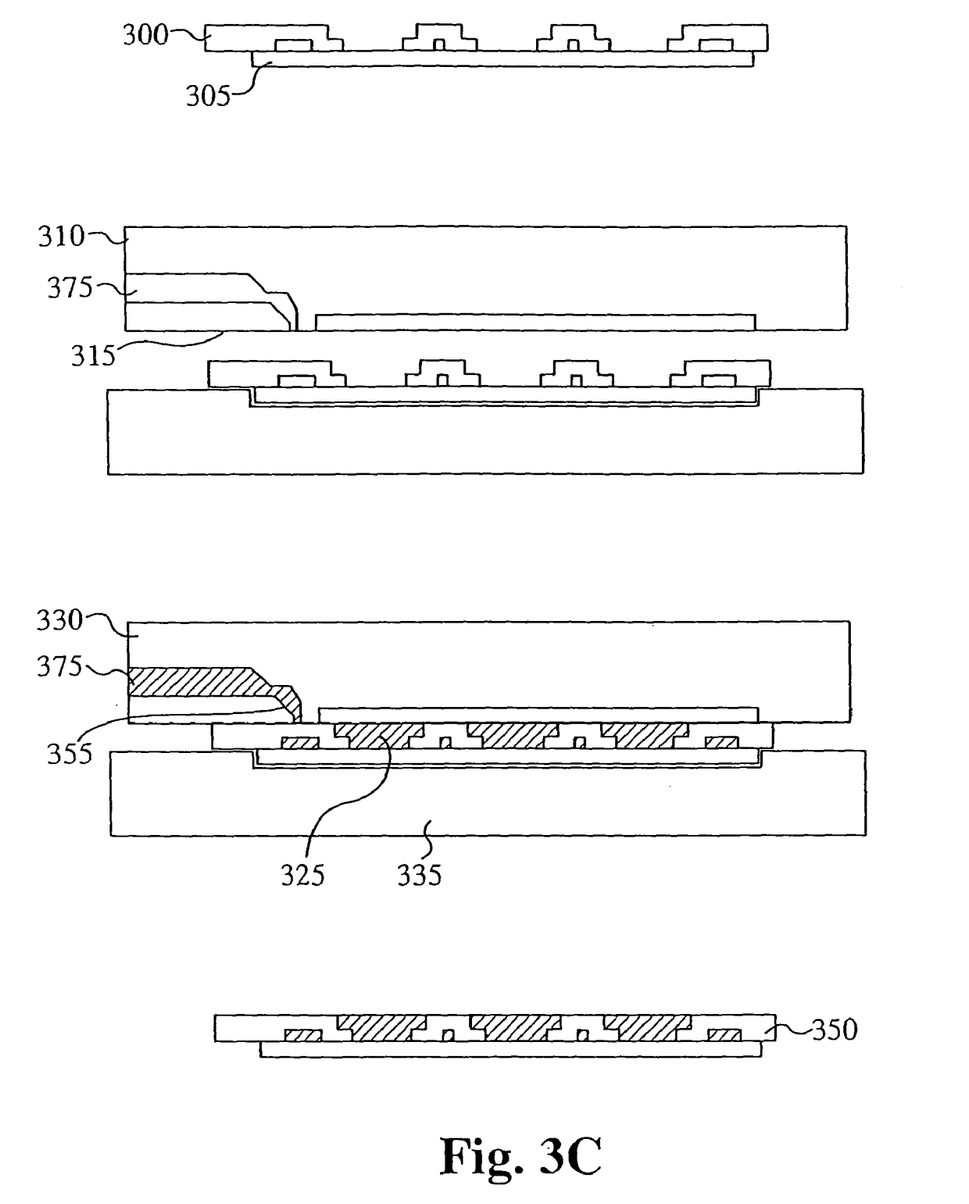
FIG. 3C shows a process of forming a molded half etched leadframe per an alternative embodiment of the current invention.
Figure 3D:
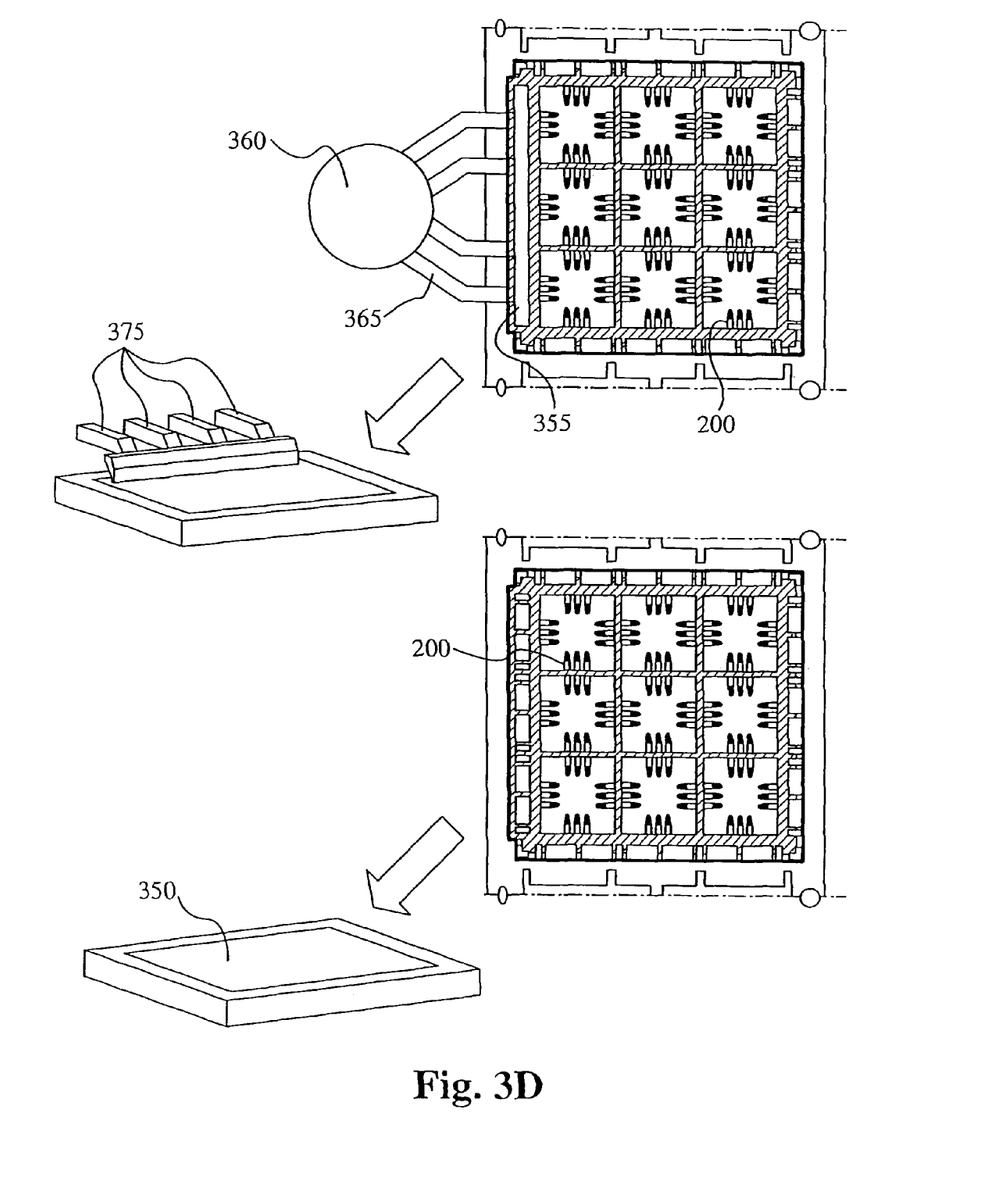
FIG. 3D is another view of the process of forming a molded half etched leadframe of FIG. 3C.

FIG. 3C shows an alternate embodiment of the process shown in FIG. 3A. In this alternative exemplary embodiment, the half etched leadframe 300 is mounted to a tape carrier 305. The half etched leadframe 300 and carrier tape 305 are placed between a top mold 310 having a tape loader on the mold surface 313 and a bottom mold 335. The tape loader effectuates the movement of the half etched leadframe 300 through the mold. In some embodiments, the top mold 310 comprises a pincer gate 375. The pincer gate 375 is coupled to the leadframe 300 to effectuate the injection therein of a mold compound 325. The mold compound 325 is fed into the pincer gate 375 through a cavity 320. The mold compound 325 is allowed to cool and set. Then, the molded half etched leadframe 350 is removed from the top mold 310 and bottom mold 335. In some embodiments, the tape carrier 305 is left attached to the molded half etched leadframe 350 to carry it through later assembly steps. The process of FIG. 3C is seen from top and isometric views in FIG. 3D. The leadframe matrix 305 is shown without the top mold 310. A mold pot and cull liquefies a mold compound and distributes the mold compound through mold runners 365 to the pincer gate 375. The mold pot and cull 360 and runners 365 are removed to leave the molded half etched leadframe 350. Advantageously, no film gate 355 remains on the molded half etched leadframe 350 when the pincer gate is used to deliver the mold compound.

Figure 4:
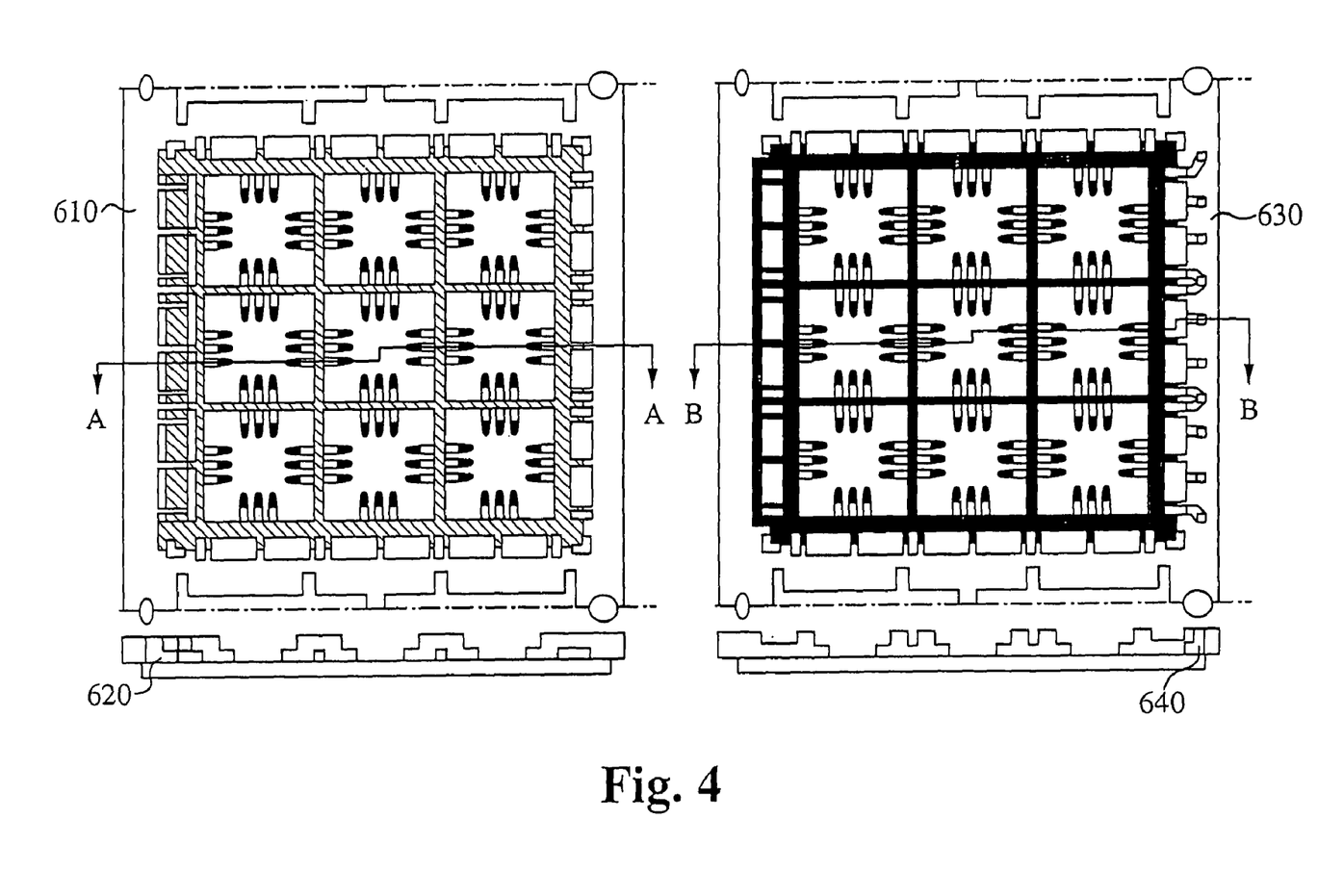
FIG. 4 shows alternative half etched leadframe matrices from top and cross sectional views.

FIG. 4 shows an alternative embodiment for the leadframe matrices of FIG. 2. In this embodiment, the leadframe matrix 610, comprises a support gate 620 and is etched from both a top and a bottom surface. The support gate 620 is configured to allow easy flow therein of a liquified mold compound (not shown). Alternatively, a leadframe matrix 630 comprises a vacuum pipe 640. Applying a partial vacuum to the vacuum pipe 640 further enhances the even distribution of liquified mold compound. A leadframe matrix can comprise both the support gate 620 and the vacuum pipe 640 for still further enhanced liquid mold compound encapsulation.

Figure 5A:
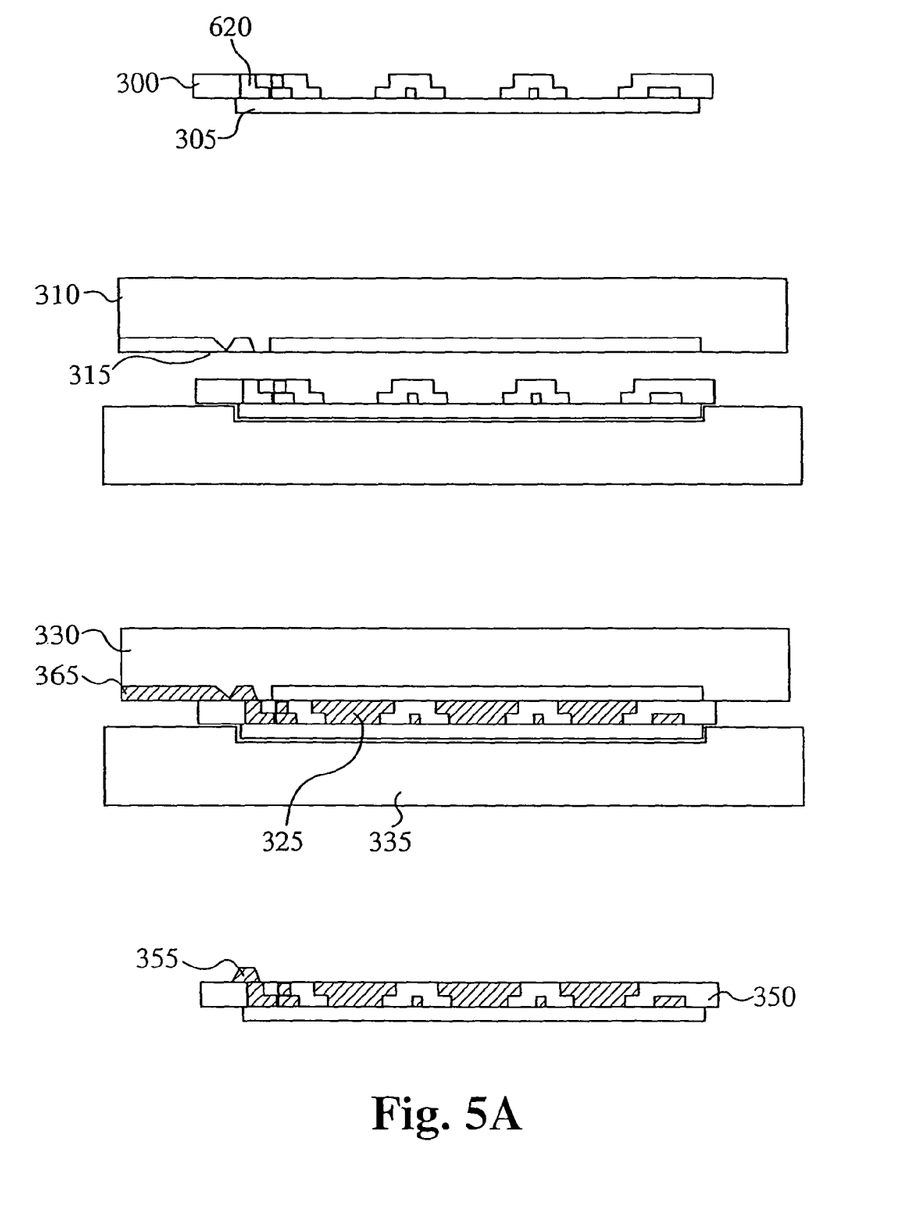
FIG. 5A shows an alternative process of forming a molded half etched leadframe.

FIG. 5A shows an process of molding a leadframe matrix 300 having a support gate 620. The half etched leadframe 300 is mounted to a carrier tape. The leadframe matrix 300 is placed between a top mold 310 having a film gate 315 and a bottom mold 335. Mold compound 365 is injected in a liquid state into the film gate 315. Advantageously, the support gate 620 is aligned with the film gate 315 to effectuate the even flow therein of liquified mold compound 365. The top mold 310 and bottom mold 335 are removed. A film gate remainder 355 is able to be removed in a later process step or discarded when individual semiconductor devices are singulated.

Figure 5B:
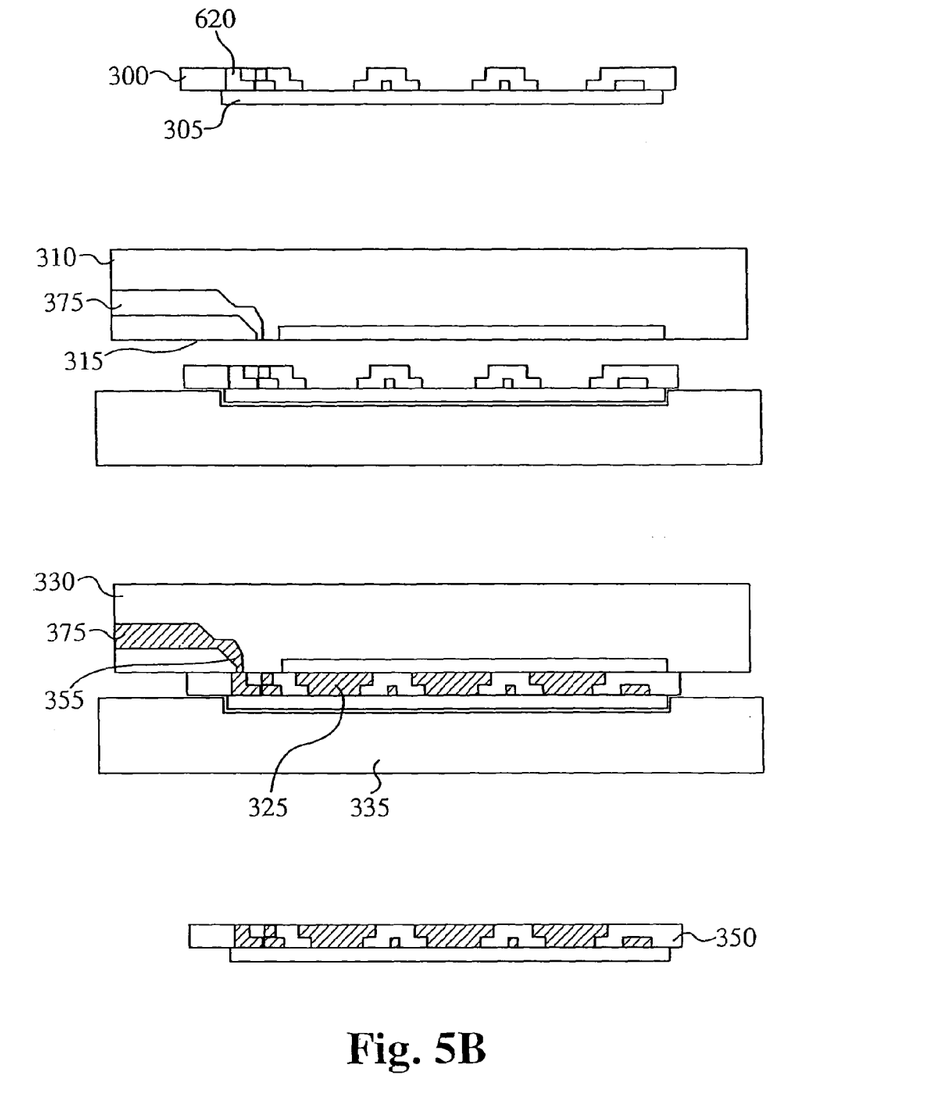
FIG. 5B shows an alternative process of forming a molded half etched leadframe.

FIG. 5B shows an process of molding a leadframe matrix 300 having a support gate 620. The half etched leadframe 300 is mounted to a carrier tape. The leadframe matrix 300 is placed between a top mold 310 having a pincer gate 375 and a bottom mold 335. Mold compound 355 is injected in a liquid state into the pincer gate 375. Advantageously, the support gate 620 is aligned with the pincer gate 375 to effectuate the even flow therein of liquified mold compound 355. The mold compound 355 fills the cavities 325 in the half etched leadframe 300 to form a half etched molded leadframe 350. The top mold 310 and bottom mold 335 are removed. The carrier tape 305 is able to be removed in a later process step if desired.

Figure 5C:
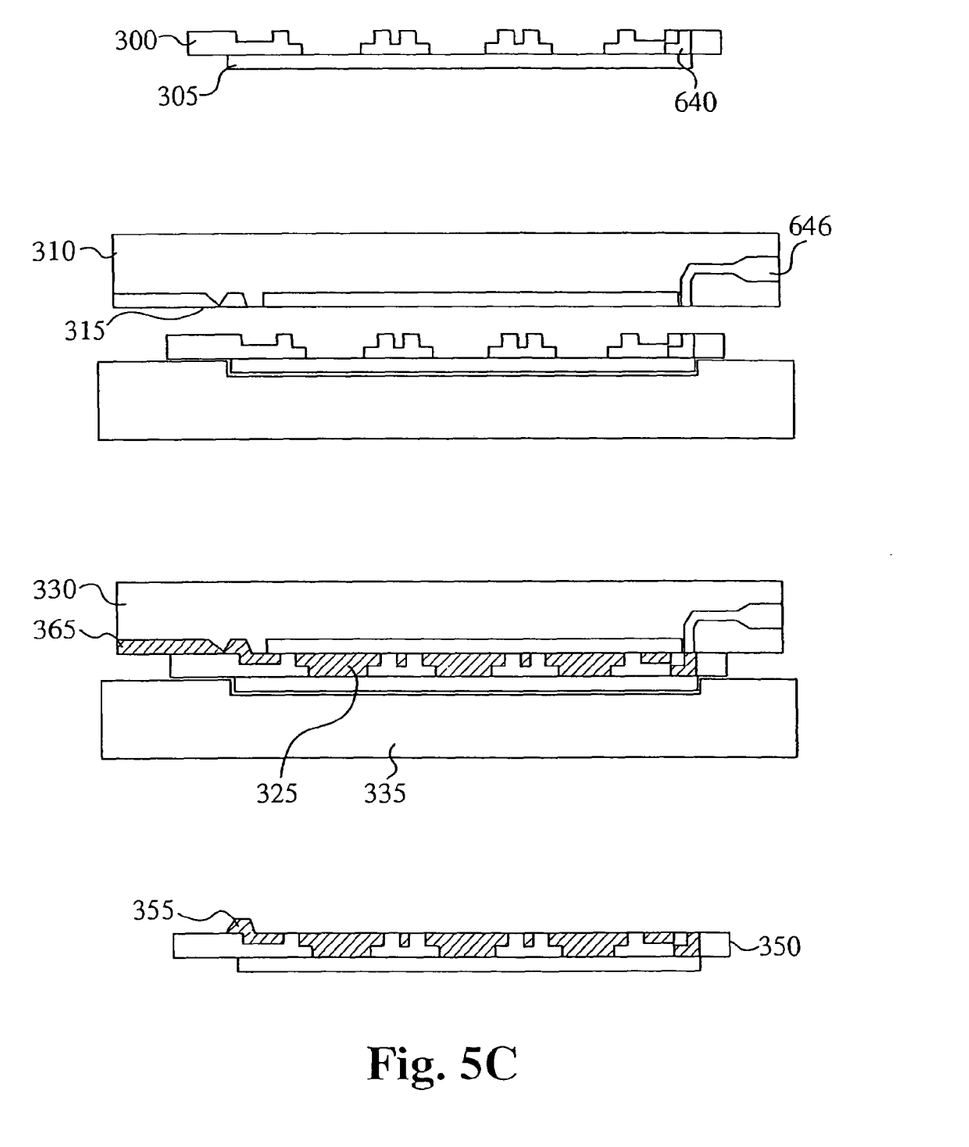
FIG. 5C shows an alternative process of forming a molded half etched leadframe.

FIG. 5C shows another alternative to the process described in FIG. 5A. The half etched leadframe matrix 300 having a vacuum pipe 640 is mounted to a carrier tape 305. The leadframe matrix 300 is placed between a top mold 310 and a bottom mold 335. In this embodiment, the top mold 310 comprises a vacuum exhaust 646. When mold compound 365 is pumped in through the film gate 315, a partial vacuum is formed at the vacuum exhaust 646 to effectuate the more even distribution of the mold compound 365 into the cavities 325 of the half etched leadframe 300.

Figure 5D:
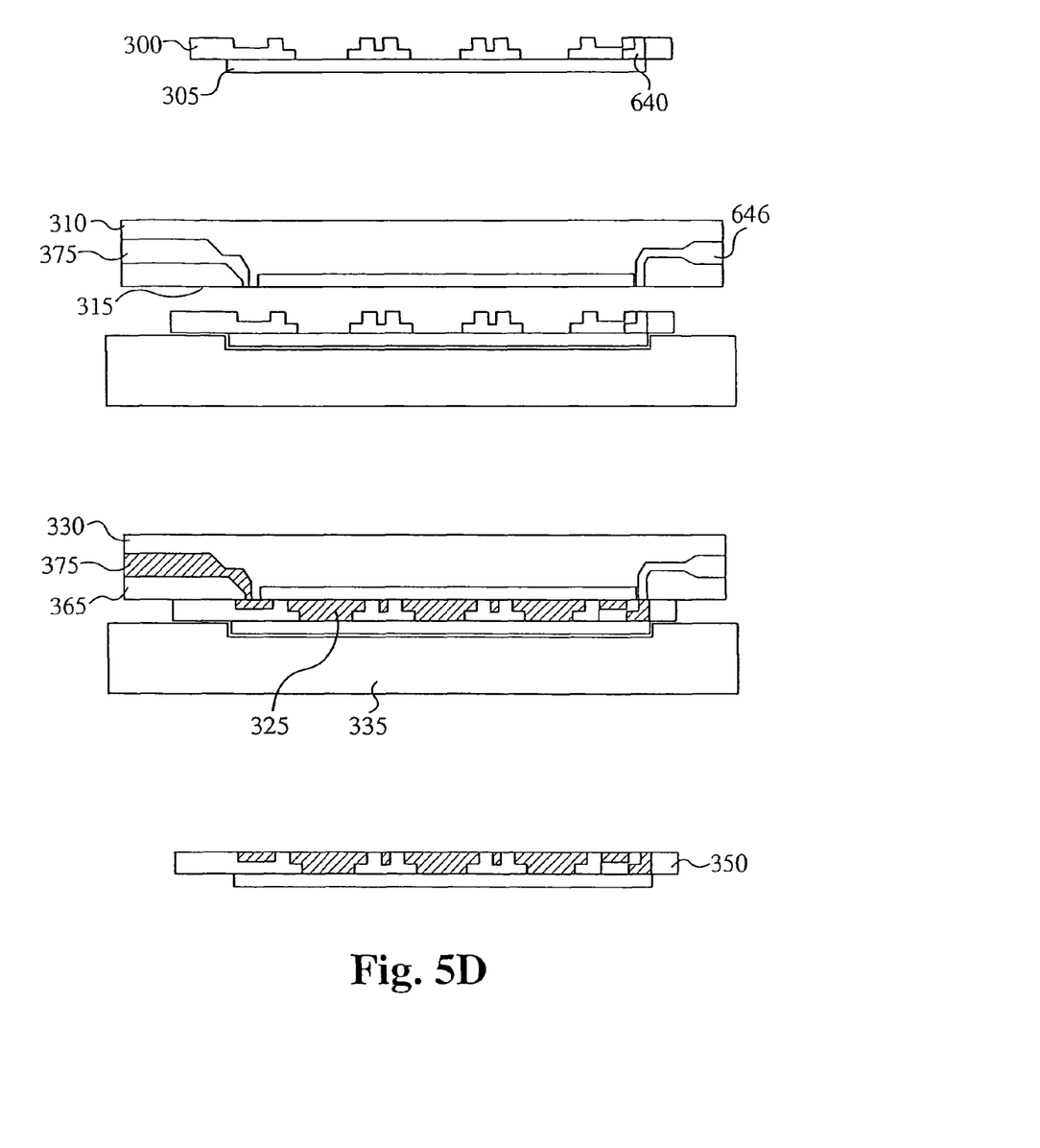
FIG. 5D shows an alternative process of forming a molded half etched leadframe.

FIG. 5D shows another alternative to the process described in FIG. 5B. The half etched leadframe matrix 300 having a vacuum pipe 640 is mounted to a carrier tape 305. The leadframe matrix 300 is placed between a top mold 310 and a bottom mold 335. In this embodiment, the top mold 310 comprises a vacuum exhaust 646. When mold compound 365 is pumped in through the pincer gate 375, a partial vacuum is formed at the vacuum exhaust 646 to more evenly distribution of the mold compound 365 into the cavities 325 of the half etched leadframe 300. A more ideal vacuum is able to be formed with equipment configured to create larger negative pressures as required by specific applications that do not deviate from the teachings of this disclosure.

Figure 6:
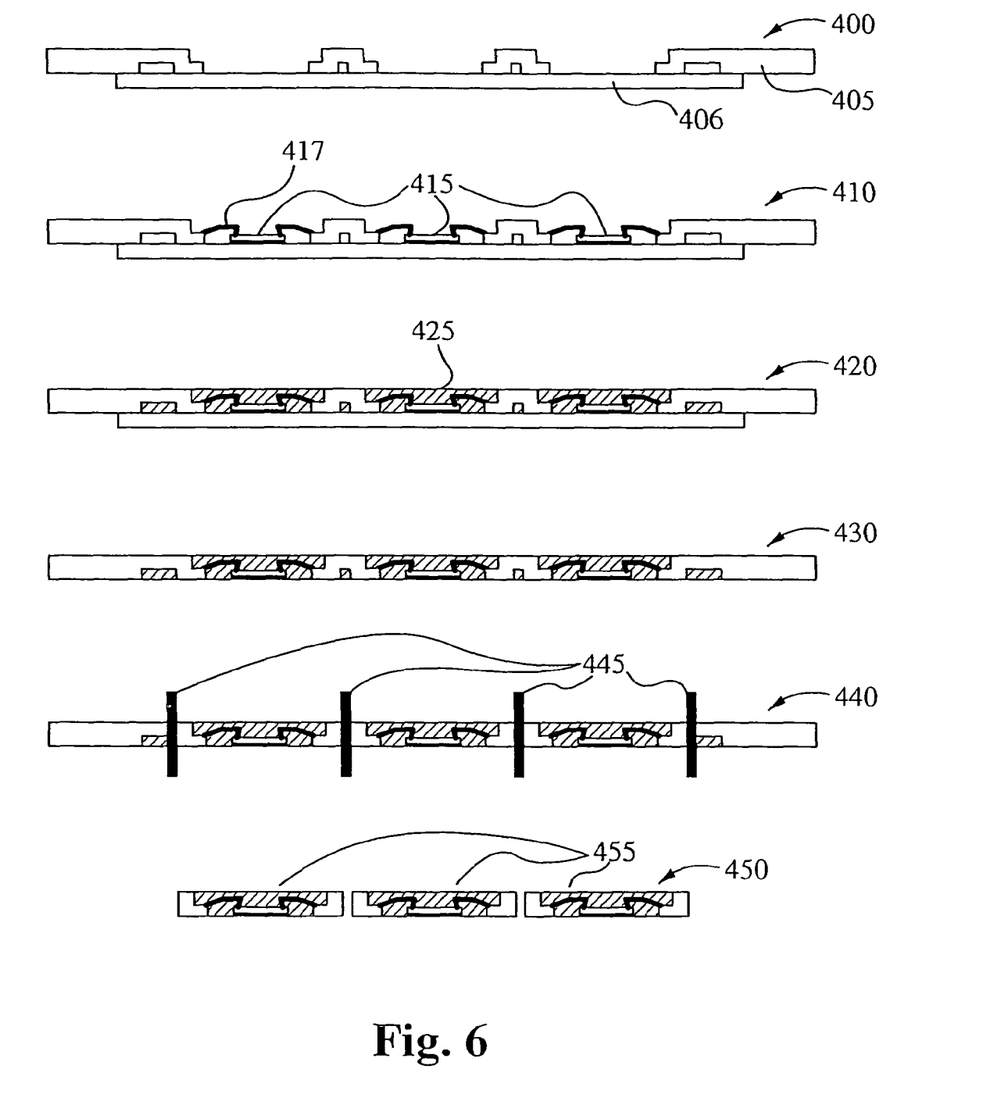
FIG. 6 is a process of applying the half etched leadframe to assemble semiconductor packages.

FIG. 6 shows a process 400 of applying the half etched leadframe 405. The half etched leadframe 405 is mounted to a carrier tape 406 for transport through the process. It will be appreciated that many commercially available machines are able to carry out the steps described herein. In the next step 410, semiconductor die 415 are mounted to individual leadframe units within the leadframe matrix. Semiconductor die 415 are mounted to the leadframe units by tape or adhesive. The semiconductor die 415 are preferably placed by pick and place automated machines. Generally, a pick and place machine comprises a robotic arm that picks up semiconductor die that have been singulated from a wafer and places them in a desired location and orientation within an individual leadframe unit. In some applications, multiple die are placed in a leadframe unit. These multiple die are able to be side by side or stacked on top of each other as applications require. Also, wire bonds 417 are attached from bond pads on the semiconductor die 415 to the leadframe units to effectuate electrical communication between the semiconductor die and the board to which the finished product will be mounted to. Next, in a step 420, the half etched leadframe 405 is molded in a process such as the ones described in FIGS. 3A-3D. The carrier tape 406 is removed in a step 430. The molded leadframe is moved to a sawing step 440 where saws 445 singulate the leadframe matrix thereby forming individual semiconductor devices 450.

Figure 7:
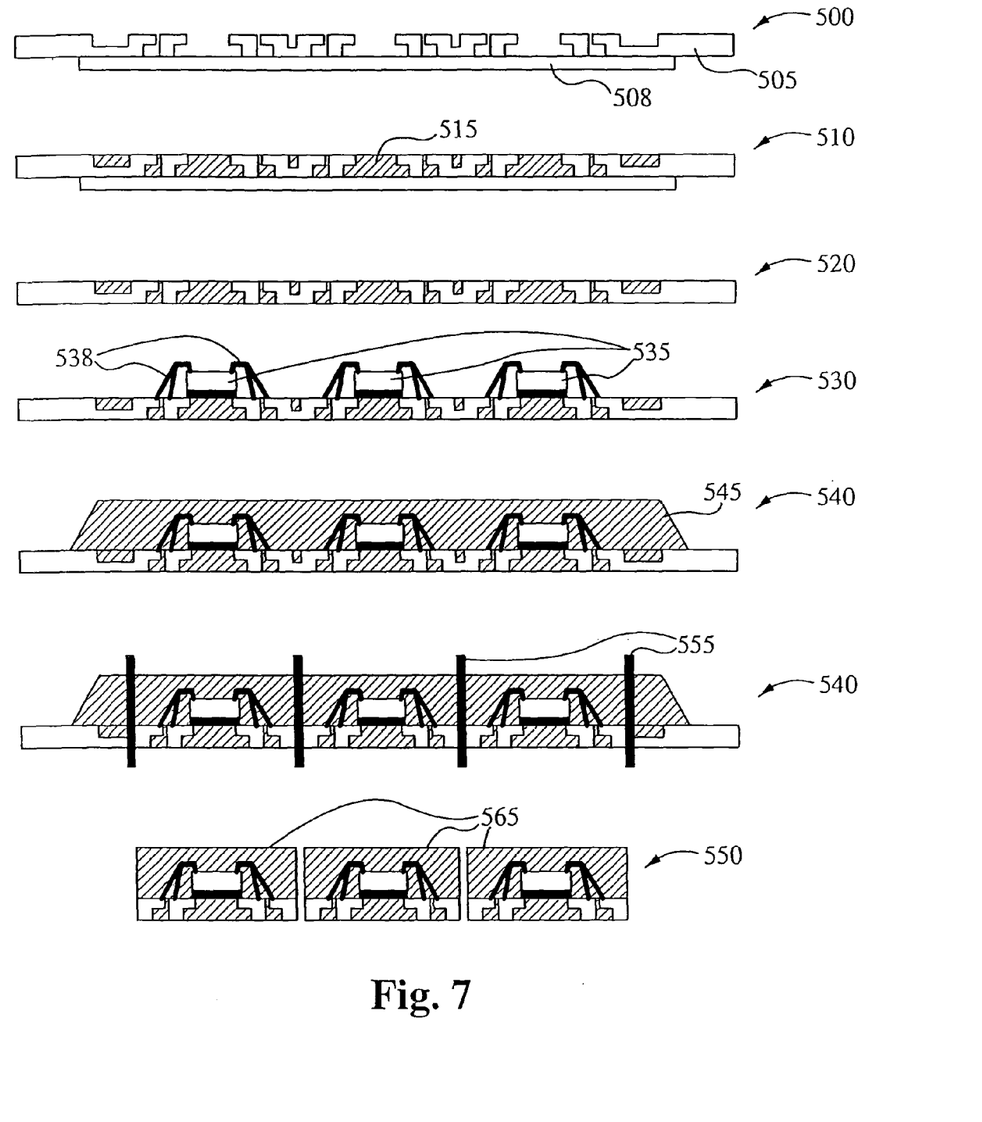
FIG. 7 is an alternative process of applying the half etched leadframe to assemble semiconductor packages.

An alternative application is shown in FIG. 7. The process 500 starts with a half etched leadframe 505 mounted to a carrier tape 508. In the next step 510, the half etched leadframe is filled with a first mold compound 515 in one of the processes described in FIGS. 3A-3D. In the next step 520, the carrier tape 508 is removed. In the step 530, semiconductor die 535 are mounted to individual leadframe units. In some embodiments, the die 535 are electrically coupled to the leadframe 505 by wirebonds 538. In a step 540, a second mold compound 545 is used to encapsulate the leadframe having the semiconductor devices 535. The leadframe matrix 505 is singulated by saw blades 555 in a step 540, thereby forming individual semiconductor devices 565 in a final step 550. The half etched leadframe technique of FIGS. 3A-3D is able to be used to make a thin profile semiconductor package 450 as described in FIG. 4 or a thicker profile package 550 of FIG. 5.

What is claimed is:

1. A system for forming singulated semiconductor devices comprising:
    a. a top mold comprising an injector for injecting a mold compound in a liquid state; and
    b. a bottom mold configured to hold a leadframe matrix to receive the mold compound in a liquid state thereby forming a molded leadframe matrix;
    c. a pick and place mechanism for placing semiconductor die in individual leadframe units; and
    d. at least one cutting element for singulating the molded leadframe matrix thereby forming singulated semiconductor devices.

2. The system for forming singulated semiconductor devices according to claim 1 wherein the injector comprises a film gate.

3. The system for forming singulated semiconductor devices according to claim 1 wherein the injector comprises a pincer gate.

4. The system for forming singulated semiconductor devices according to claim 1 further comprising a tape carrier for carrying the leadframe units.

5. The system for forming singulated semiconductor devices according to claim 1 wherein the at least one cutting element comprises a saw.

6. The system for forming singulated semiconductor devices according to claim 1 wherein the at least one cutting element comprises a punch.

7. The system for forming singulated semiconductor devices according to claim 1 wherein the injector comprises a pincer gate.

8. The system for forming singulated semiconductor devices according to claim 1 wherein the injector comprises a film gate.

9. The system for forming singulated semiconductor devices according to claim 1 further comprising a vacuum pump output.

* * * * *

UNITED STATES PATENT AND TRADEMARK OFFICE
CERTIFICATE OF CORRECTION

| | | |
|---|---|---|
| PATENT NO. | : 8,338,922 B1 | Page 1 of 1 |
| APPLICATION NO. | : 12/661444 | |
| DATED | : December 25, 2012 | |
| INVENTOR(S) | : Sirinorakul et al. | |

It is certified that error appears in the above-identified patent and that said Letters Patent is hereby corrected as shown below:

IN THE CLAIMS

In the Claims, in Claim 1, limitation c., at column 6, line 33, please insert the word --a-- between the words "placing" and "semiconductor" so that the claim limitation correctly reads:

-- c. a pick and place mechanism for placing a semiconductor die in individual leadframe units; and --

Signed and Sealed this
Fifth Day of February, 2013

Teresa Stanek Rea
*Acting Director of the United States Patent and Trademark Office*